(12) United States Patent  (10) Patent No.: US 8,941,119 B2
Miyachi et al.  (45) Date of Patent: Jan. 27, 2015

(54) SEMICONDUCTOR LIGHT EMITTING ELEMENT

(71) Applicant: Stanley Electric Co., Ltd., Meguro-ku, Tokyo (JP)

(72) Inventors: Mamoru Miyachi, Okegawa (JP); Tatsuma Saito, Yokohama (JP); Takako Hayashi, Yokohama (JP); Yasuyuki Shibata, Yokohama (JP); Yusuke Yokobayashi, Yokohama (JP); Takanobu Akagi, Yokohama (JP); Ryosuke Kawai, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 14/257,666

(22) Filed: Apr. 21, 2014

(65) Prior Publication Data

US 2014/0319534 A1    Oct. 30, 2014

(30) Foreign Application Priority Data

Apr. 25, 2013 (JP) .................................. 2013-092427

(51) Int. Cl.
*H01L 29/15* (2006.01)
*H01L 33/32* (2010.01)
*H01L 33/40* (2010.01)
*H01L 33/62* (2010.01)

(52) U.S. Cl.
CPC .............. *H01L 33/32* (2013.01); *H01L 33/405* (2013.01); *H01L 33/62* (2013.01)
USPC ............................................. 257/76; 257/13

(58) Field of Classification Search
USPC ......................................................... 257/76, 13
See application file for complete search history.

(56) References Cited

U.S. PATENT DOCUMENTS

| 7,646,036 | B2 | 1/2010 | Kozawa et al. | |
| 2012/0292631 | A1* | 11/2012 | Katsuno et al. | 257/76 |
| 2014/0014895 | A1* | 1/2014 | Tanaka | 257/13 |

FOREIGN PATENT DOCUMENTS

JP    2008-192782 A    8/2008

* cited by examiner

*Primary Examiner* — Douglas Menz
(74) *Attorney, Agent, or Firm* — Holtz, Holtz, Goodman & Chick PC

(57) ABSTRACT

A semiconductor light emitting element comprises an optical semiconductor laminated layer providing vias, an electrode that is disposed on a surface of the optical semiconductor laminated layer and separated from the second semiconductor layer in a peripheral portion of the electrode, a first transparent insulating layer that is disposed between the peripheral portion of the electrode and the optical semiconductor laminated layer, and a second transparent insulating layer that is disposed to cover the electrode, that envelops the peripheral portion of the electrode together with the first transparent insulating layer.

10 Claims, 7 Drawing Sheets

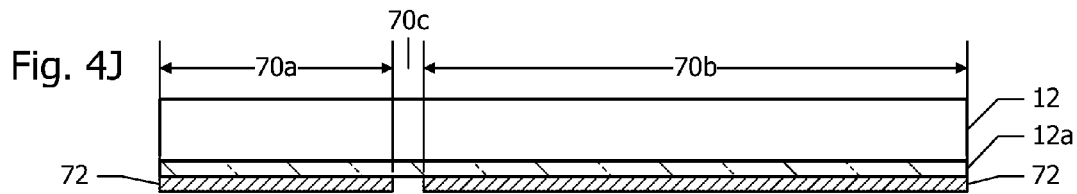
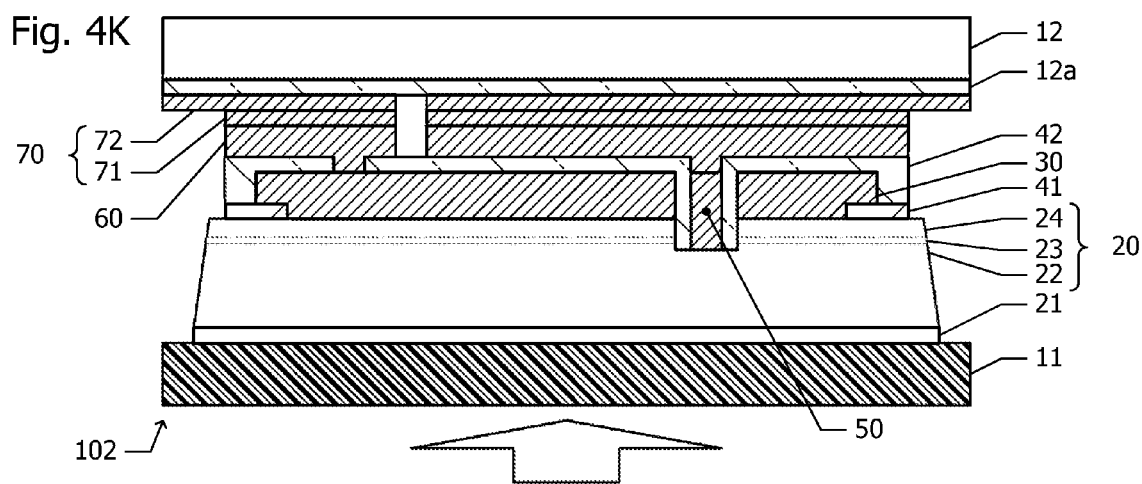
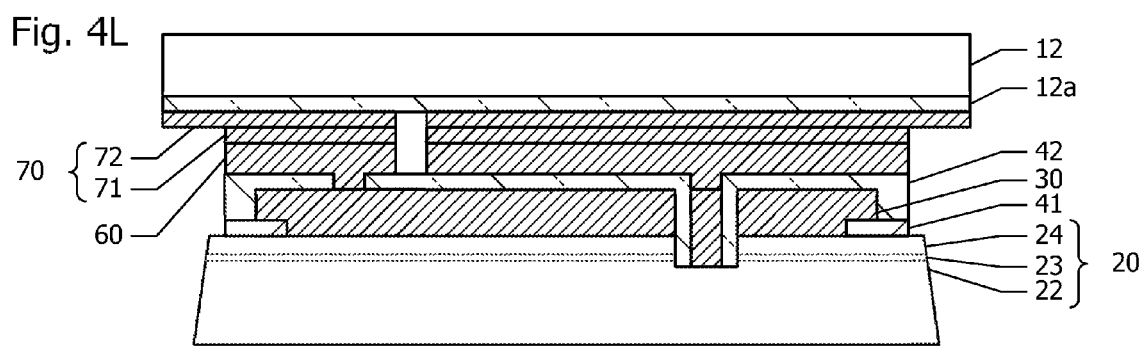
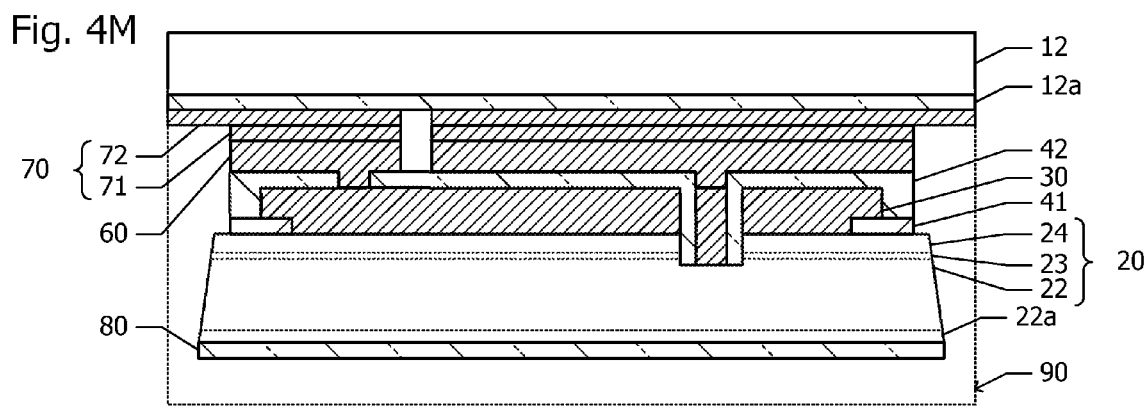

SEMICONDUCTOR LIGHT EMITTING ELEMENT

CROSS REFERENCE TO RELATED APPLICATION

This application is based upon and claims the benefit of priority of the prior Japanese Patent Application No. 2013-092427, filed on Apr. 25, 2013, the entire contents of which are incorporated herein by reference.

FIELD OF THE INVENTION

The embodiments discussed herein are related to a semiconductor light emitting element having a via-structure.

BACKGROUND

The semiconductor light emitting element (LED element) using a nitride semiconductor such as GaN can emit UV light or blue light and also can emit white light by utilizing a florescent substance (phosphor). Such a semiconductor light emitting element is used for lighting equipment such as a lighting tool for a vehicle.

The LED element includes at least an optical semiconductor laminated layer and electrodes to apply an electric voltage to the optical semiconductor laminated layer. The optical semiconductor laminated layer has a structure stacking, for example, a n-type GaN layer, an active layer having a light emitting property and a p-type GaN layer. The electrodes contacts with the n-type and p-type GaN layers, respectively. The LED element is classified into a counter electrode type, a flip chip type, a junction down type, a via type, or the like, according to the difference of a structure of the electrodes, an arrangement position of the electrodes, or the like.

A material having high optical reflectance, for example, Ag or an Ag alloy can be generally used as the electrodes in order to enhance the light emitting efficiency (=light intensity of light emitted from a surface of the optical semiconductor laminated layer/light intensity in the active layer) of the LED element. However, the electrodes including Ag or the like easily migrates, and causes problems on reliability such as electric short circuiting, leakage, or the like of the LED element.

It is desirable to provide a cap layer (migration suppressing layer) that covers the entire surface of the electrodes in order to suppress the migration of the electrodes including Ag or the like. The cap layer includes, for example, refractory metal, a metal nitride, or the like (for example, Japanese Laid-open Patent Publication No. 2008-192782).

SUMMARY

According to an aspect of this invention, there is provided a semiconductor light emitting element comprising:

an optical semiconductor laminated layer that is obtained by stacking a first semiconductor layer including a GaN-based semiconductor of a first conductivity type, an active layer formed on the first semiconductor layer, having a light emitting property, and including a GaN-based semiconductor, and a second semiconductor layer formed on the active layer, and including a GaN-based semiconductor of a second conductivity type different from the first conductivity type, and in which when a surface on the first semiconductor layer side is a first surface and a surface on the second semiconductor side is a second surface, the second surface includes concave region formed by removing the second semiconductor layer and the active layer and exposing the first semiconductor layer, and convex region surrounding the concave region and exposing the second semiconductor layer;

a first electrode that is disposed on the concave region of the optical semiconductor laminated layer and that is in contact with the first semiconductor layer exposed in the concave region;

a second electrode that is disposed on the convex region of the optical semiconductor laminated layer, that is separated from the second semiconductor layer in a peripheral portion of the second electrode, that is in contact with the second semiconductor layer in a region except for the peripheral portion of the second electrode, and that includes at least Ag;

a first transparent insulating layer that is disposed between the peripheral portion of the second electrode and the second semiconductor layer of the optical semiconductor laminated layer, and that has a light transmitting property and an electrical insulating property; and a second transparent insulating layer that is disposed to cover the second electrode, that envelops the peripheral portion of the second electrode together with the first transparent insulating layer, and that has a light transmitting property and an electrical insulating property.

The object and advantages of the invention will be realized and attained by means of the elements and combinations particularly pointed out in the claims.

It is to be understood that both the foregoing general description and the following detailed description are exemplary and are not restrictive of the invention, as claimed.

BRIEF DESCRIPTION OF THE DRAWINGS

FIGS. 4A to 4M are cross-sectional views illustrating processes of manufacturing the LED element array or the LED element according to the embodiment.

DESCRIPTION OF THE PREFERRED EMBODIMENTS

Figure 5A:
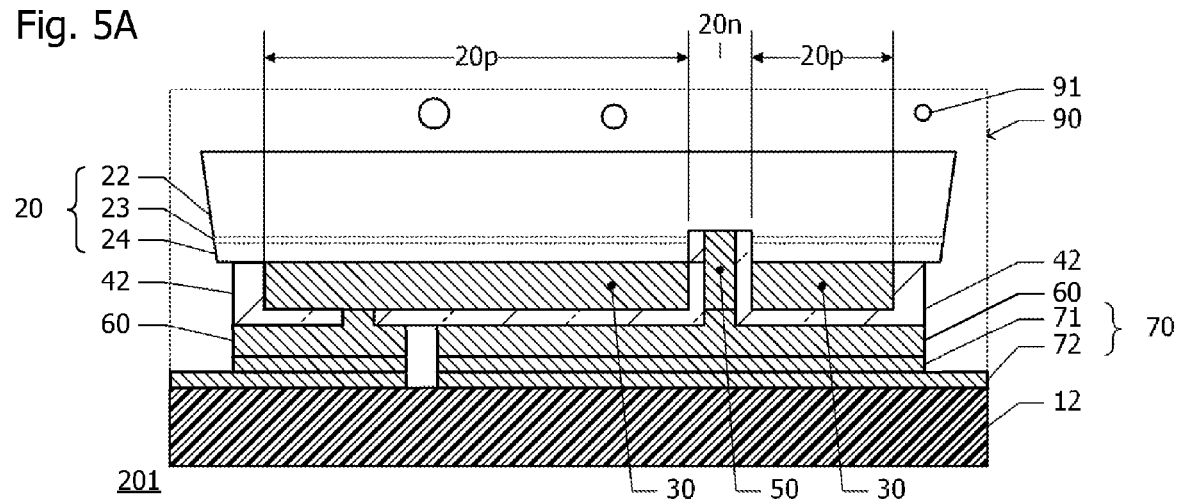
FIGS. 5A and 5B are cross-sectional views illustrating an LED element according to a reference example.

FIG. 5A is a cross-sectional view totally illustrating a via-type LED element 201 according to a reference example. The LED element 201 mainly includes an optical semiconductor laminated layer 20, a first electrode (n-side electrode) 50, and a second electrode (p-side electrode) 30. Further, the LED element 201 is supported to a supporting substrate 12 having an electrical insulating property through a fusion layer 70 (including first and second adhesion layers 71 and 72) having conductivity.

The optical semiconductor laminated layer 20 has a multi-layer structure obtained by stacking at least a p-type semiconductor layer 24, an active layer (emission layer) 23 having a light emitting property, and an n-type semiconductor layer 22, from the supporting substrate 12 side. Further, the optical semiconductor laminated layer 20 has a convex region 20p in which the p-type semiconductor layer 24 faces the supporting substrate 12, and a concave region (via) 20n in which the p-type semiconductor layer 24 and the active layer 23 are removed (etched) and the n-type semiconductor layer 22 faces the supporting substrate 12.

The first electrode (n-side electrode) 50 is disposed in the concave region 20n of the optical semiconductor laminated layer 20 to be in contact with the n-type semiconductor layer 22. The second electrode (p-side electrode) 30 is disposed in the convex region 20p of the optical semiconductor laminated layer 20 to be in contact with the p-type semiconductor layer 24. The p-side electrode 30 includes at least Ag having a high light reflecting property. In addition, an insulating layer 42 made with $SiO_2$ or the like is disposed between the p-side electrode 30 and the n-side electrode 50 so that the p-side electrode 30 and the n-side electrode 50 are not electrically connected.

Electric power is supplied from the p-side electrode 30 and the n-side electrode 50 to the optical semiconductor laminated layer 20 through a conductive layer 60 having conductivity (and the fusion layer 70 electrically connected to the conductive layer 60). That is, electric current flows between the p-type semiconductor layer 24 and the n-type semiconductor layer 22. According to this, light is emitted from the active layer 23. From among light emitted from the active layer 23, some are emitted directly from the surface of the n-type semiconductor layer 22, and others are reflected on the p-side electrode 30 and then emitted from the surface of the n-type semiconductor layer 22.

Further, a sealing resin (florescent layer) 90 that generally covers the optical semiconductor laminated layer 20 and includes a plurality of florescent fine particles 91 may be further provided to the LED element 201. when the optical semiconductor laminated layer 20 includes a GaN-based semiconductor that emits blue light, white light is emitted from the LED element 201 by arranging the florescent layer 90 that emits yellow light.

Figure 5B:
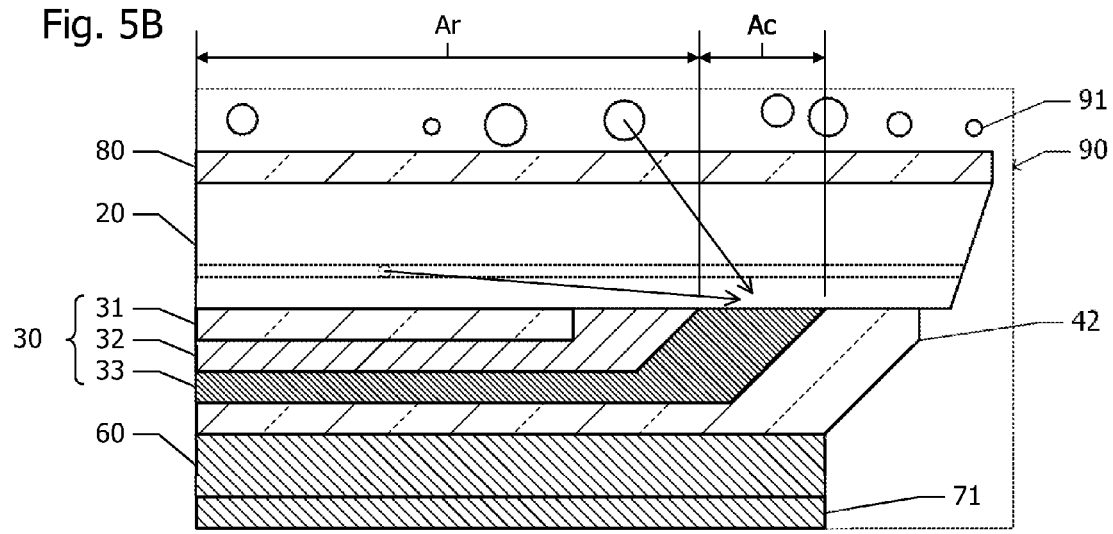

FIG. 5B is a cross-sectional view partially illustrating a part near the periphery of the LED element 201. The p-side electrode 30 includes, for example, a contact layer 31 that is in ohmic contact with the p-type semiconductor layer 24 of the optical semiconductor laminated layer 20, a light reflective layer 32 that covers the contact layer 31 and includes a material with high optical reflectance such as Ag, and a cap layer 33 that covers the light reflective layer 32 and suppresses the migration of the light reflective layer 32. The cap layer 33 generally includes a material with low optical reflectance.

The cap layer 33 generally has a structure of protruding from the light reflective layer 32 and covering the end portion of the light reflective layer 32 in order to effectively suppress the migration of the light reflective layer 32. The cap layer 33 generally has a lower optical reflectance than the light reflective layer 32. Therefore, with respect to the light emitting surface of the optical semiconductor laminated layer 20, it is possible that the light intensity in a region Ac in which the cap layer 33 protrudes from the light reflective layer 32 is extremely low compared to the light intensity in the other region Ar. That is, in the LED element 201, significant luminance unevenness may be generated. In addition, the balance between the emitted light (for example, blue light) from the optical semiconductor laminated layer 20 and the fluorescent light (for example, yellow light) by the florescent layer 90 is different from the region Ac to the region Ar. Therefore, significant color unevenness may be generated.

It is desirable, from the point of view of the quality of the appearance, that the luminance unevenness or the color unevenness in the LED element is improved. The inventors of the invention have made studies with respect to a structure of an LED element in which a migration of electrodes including Ag and the like is suppressed and luminance unevenness or color unevenness is suppressed.

Figure 1A:
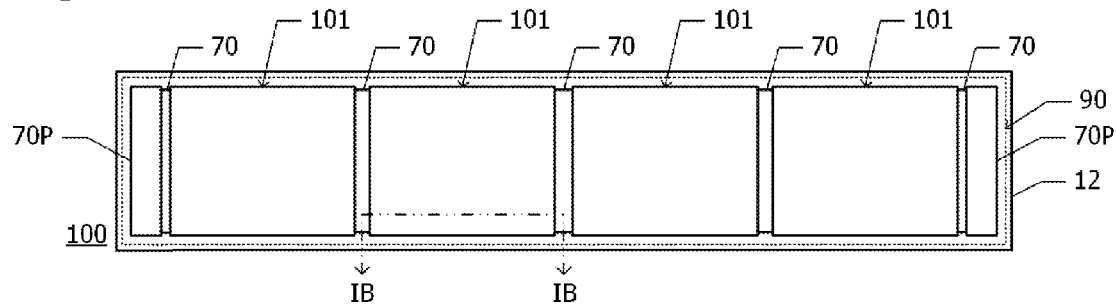
FIG. 1A is a plan view illustrating an LED element array according to an embodiment.

FIG. 1A is a plan view generally illustrating the LED element array 100 according to an embodiment of the invention. The LED element array 100 is used, for example, as a lighting tool for a vehicle.

The LED element array 100 includes a plurality of LED elements 101 electrically connected in series, and the florescent layer 90 that covers the plurality of LED elements 101. The plurality of LED elements 101 are supported by the supporting substrate 12 through the fusion layer 70 having conductivity. A power supply pad 70p for supplying electric power to the plurality of LED elements 101 connected in series is provided on the both ends of the supporting substrate 12.

Figure 1B:
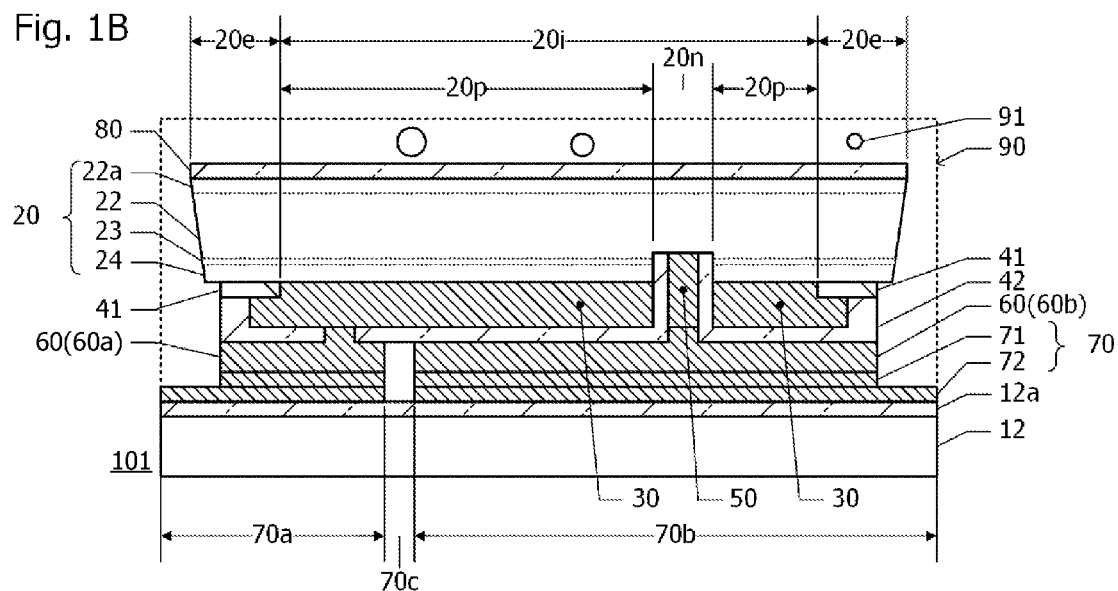
FIGS. 1B and 1C are cross-sectional views illustrating an LED element that configures the LED element array.

FIG. 1B is a cross-sectional view illustrating any one LED element 101 from among the plurality of LED elements 101 that configure the LED element array 100. FIG. 1B is a cross-sectional view corresponding to a cross section taken along, for example, the line IB-IB in FIG. 1A. Further, the plurality of LED elements 101 that configures the LED element array 100 all have the same configurations. Each of the LED elements 101 mainly includes the optical semiconductor laminated layer 20, the n-side electrode 50, the p-side electrode 30, and first and second transparent insulating layers 41 and 42.

The optical semiconductor laminated layer 20 has a multi-layered structure obtained by stacking at least the p-type semiconductor layer 24, the active layer (emission layer) 23 having a light emitting property, and the n-type semiconductor layer 22, from the supporting substrate 12 side. Further, in the surface of the optical semiconductor laminated layer 20, a region that is sectioned relatively on the inner side is referred to as an inside region 20i, and a region that is sectioned relatively on the outer side is referred to as an outside region 20e. At this point, the inside region 20i of the optical semiconductor laminated layer 20 has the convex region 20p in which the p-type semiconductor layer 24 faces the supporting substrate 12, and the concave region (via) 20n in which the p-type semiconductor layer 24 and the active layer 23 are removed (etched) and the n-type semiconductor layer 22 faces the supporting substrate 12.

In FIG. 1B, one via (the concave region 20n) is illustrated in the inside region 20i, for convenience. However, in reality, a plurality of vias are provided in the inside region 20i (see FIGS. 3A to 3B).

Each layer of the optical semiconductor laminated layer 20 includes a GaN-based semiconductor represented by $Al_xIn_yGa_zN$ (x+y+z=1). The p-type semiconductor layer 24 and the n-type semiconductor layer 22 include p-type GaN and n-type GaN, respectively. The active layer 23 has a multi-quantum well structure obtained by stacking, for example, barrier layers including GaN and well layers including InGaN.

In addition, the optical semiconductor laminated layer 20 is not limited to the configuration described above, but may be obtained by forming a micro-cone structured layer (fine roughness layer) 22a on the n-type semiconductor layer 22. Further, a clad layer (electron block layer) made with AlGaN may be formed for example, between the p-type semiconductor layer 24 and the active layer 23. Further, a superlattice structure layer (strain relaxation layer) obtained by stacking GaN and InGaN may be formed, for example, between the active layer 23 and the n-type semiconductor layer 22.

The n-side electrode 50 is formed between the supporting substrate 12 and the concave region 20n of the optical semiconductor laminated layer 20, to be in contact with the n-type semiconductor layer 22. The n-side electrode 50 includes preferably a material with high optical reflectance such as Ag or Al.

The p-side electrode 30 is formed between the supporting substrate 12 and the optical semiconductor laminated layer 20, so as to avoid the n-side electrode 50 (or the concave region 20n). In addition, the p-side electrode 30 also includes a main portion (a central portion) which is in contact with the p-type semiconductor layer 24 in the convex region 20p and a terminal portion (a peripheral portion) which is separated from the p-type semiconductor layer 24 in the outside region 20e. The p-side electrode 30 includes at least a material with high optical reflectance such as Ag.

The first transparent insulating layer 41 is formed, in the outside region 20e, between the optical semiconductor laminated layer 20 and the terminal portion of the p-side electrode 30, to be in contact with the p-type semiconductor layer 24. The terminal portion of the p-side electrode 30 is formed to overlay a part of the first transparent insulating layer 41. The first transparent insulating layer 41 includes a material having a light transmitting property and an electrical insulating property, such as $SiO_2$ or SiN.

The second transparent insulating layer 42 is formed between the p-side electrode 30 and the n-side electrode 50 so that the p-side electrode 30 and the n-side electrode 50 are not electrically connected to each other, and is also formed to cover the p-side electrode 30. The second transparent insulating layer is formed to envelop the terminal portion of the p-side electrode 30 together with the first transparent insulating layer 41. The second transparent insulating layer 42 includes a material having a light transmitting property and an electrical insulating property such as, for example, $SiO_2$ or SiN.

Further, The LED element 101 includes the conductive layer 60 that is disposed to cover the second transparent insulating layer 42 and has conductivity. The conductive layer 60 includes a first conductive region 60a that penetrates the second transparent insulating layer 42 and electrically connected with the p-side electrode 30, and a second conductive region 60b that is electrically connected with the n-side electrode 50 and electrically separated from the first conductive region 60a. The conductive layer 60 includes a material with high optical reflectance such as Ag and the like.

The conductive layer 60 is bonded to the supporting substrate 12 through the fusion layer 70 including the first and second adhesion layers 71 and 72. The fusion layer 70 includes, for example, Au or the like, and includes a first fusion region 70a that is electrically connected with the first conductive region 60a of the conductive layer 60 and a second fusion region 70b that is electrically connected with the second conductive region 60b of the conductive layer 60 and electrically separated from the first fusion region 70a. The first fusion region 70a (or the first conductive region 60a) and the second fusion region 70b (or the second conductive region 60b) are formed to have a gap (insulating region) 70c therebetween.

Further, the first fusion region 70a of the fusion layer 70 is formed to be continued to the second fusion region of a neighboring LED element. In addition, the second fusion region 70b of the fusion layer is formed to be continued to the first fusion region of a neighboring LED element (see FIG. 1A). For this, the plurality of LED elements 101 that configure the LED element array 100 are electrically connected to each other in series.

A surface protection layer 80 having an electrical insulating property is disposed on the surface of the n-type semiconductor layer 22 of the optical semiconductor laminated layer 20. The surface protection layer 80 includes, for example, $SiO_2$. In addition, the florescent layer 90 is disposed to cover totally the optical semiconductor laminated layer 20. The florescent layer 90 is disposed over at least the n-type semiconductor layer 22.

The supporting substrate 12 includes a material having an excellent heat radiating property (high thermal conductivity), for example, Si. On the surface of the supporting substrate 12, an insulating layer 12a including $SiO_2$ and the like is formed.

Figure 1C:
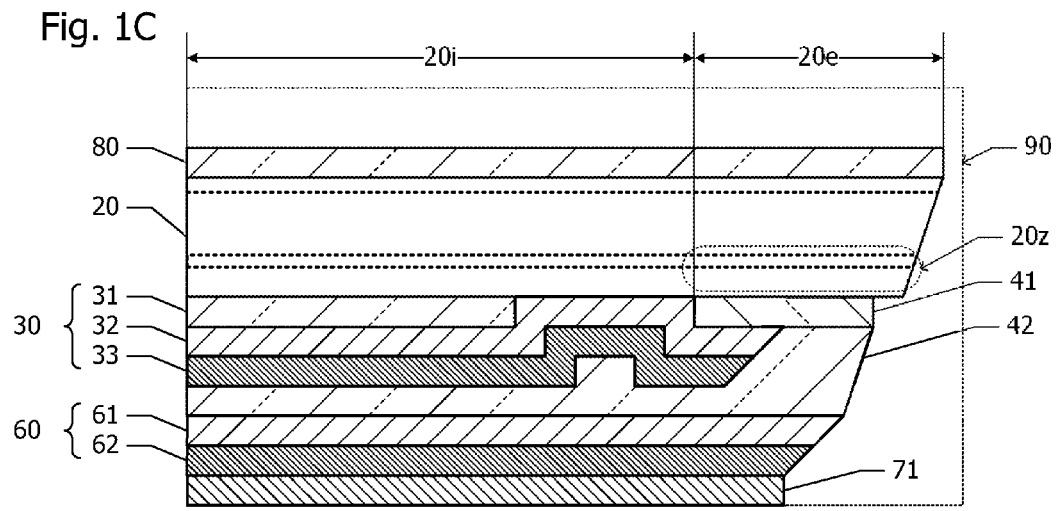

FIG. 1C is a cross-sectional view illustrating a part near the outside region 20e of the optical semiconductor laminated layer 20. The p-side electrode 30 includes, for example, the contact layer 31 that is in ohmic contact with the p-type semiconductor layer 24, the first light reflective layer 32 that covers the contact layer 31 and includes a material with high optical reflectance such as Ag, and the first cap layer 33 that covers the light reflective layer 32 and suppresses the migration of the light reflective layer 32.

The contact layer 31 is disposed to be in contact with the p-type semiconductor layer 24 in the inside region 20i of the optical semiconductor laminated layer 20, especially, in the convex region 20p thereof. The contact layer 31 includes a material that has a light transmitting property and that is in ohmic contact with the p-type semiconductor layer 24, for example, indium tin oxide (ITO). In addition to ITO, for example, Ag, Pt, Ni, Al, Pd, or an alloy thereof can be applied.

The first light reflective layer 32 is disposed to cover the contact layer 31, and also to overlay an inner side of the first transparent insulating layer 41 in the peripheral (the terminal) of the first light reflective layer 32. The first light reflective layer 32 includes Ag and the like with high optical reflectance.

The first cap layer 33 is disposed so as to overlap the first light reflective layer 32, that is, not to protrude from the first light reflective layer 32. The first cap layer 33 includes at least one material selected from the group consisting of Ti, W, Pt, Pd, Mo, Ru, Ir, Au, an alloy thereof, and a metal nitride.

Further, in the contact layer 31, the first light reflective layer 32, and the first cap layer 33, a region corresponding to the inside region 20i of the optical semiconductor laminated layer 20 corresponds to the main portion of the p-side electrode 30. And, in the first light reflective layer 32 and the first cap layer 33, a region (an edge portion) corresponding to the outside region 20e of the optical semiconductor laminated layer 20, that is, overlaying with the first transparent insulating layer 41, corresponds to the terminal portion of the p-side electrode 30.

By that the first cap layer 33 does not protrude from the first light reflective layer 32, a region in which the light intensity in the light emitting surface of the optical semiconductor laminated layer 20 is greatly decreased is not formed.

The first transparent insulating layer 41 that is disposed between the edge portion of the first light reflective layer 32 and the optical semiconductor laminated layer 20 (the p-type semiconductor layer 24) in the outside region 20e has a light transmitting property, and thus the reflection of light on the edge portion of the first light reflective layer 32 is not prevented. Therefore, the luminance unevenness and the color unevenness generated in the LED elements 101 can be suppressed.

Further, since the end portion (the edge portion) of the first light reflective layer 32 is enveloped with the first and second transparent insulating layers 41 and 42 having an electrical insulating property, the migration in the end portion of the first light reflective layer 32 can be suppressed. The effect (cap performance) of suppressing the migration of Ag and the like in the transparent insulating layer made with $SiO_2$ or SiN is generally inferior to that in the cap layer made with metal such as Ti. Therefore, it is preferable that only the end portion of the first light reflective layer 32 is enveloped by the first and second transparent insulating layers 41 and 42, and the other portion is covered with the first cap layer 33.

The conductive layer 60 may be a stacked structure obtained by stacking the second light reflective layer 61 and the second cap layer 62. The second light reflective layer 61 and the second cap layer 62 include the same material with, for example, the first light reflective layer 32 and the first cap layer 33.

In this case, by that the second light reflective layer 61 protrudes from the first light reflective layer 32, that is, includes the first light reflective layer 32 in the plan view, a region in which the light generated in the optical semiconductor laminated layer 20 (especially the active layer 23) is reflected is larger. According to this, the intensity of the light emitted from the LED elements 101 can be enhanced.

When the conductive layer 60 is configured as described above, it is concerned that the migration in the end portion of the second light reflective layer 61 may occur. In this case, the optical semiconductor laminated layer 20 in the outside region 20e (a de-activated region 20z) may be deactivated. According to this, the resistivity the optical semiconductor laminated layer 20 in the de-activated region 20z is enhanced, or the optical semiconductor laminated layer 20 in the de-activated region 20z is insulated electrically. And, even when an Ag ion or the like moves to the optical semiconductor laminated layer 20 through the side surfaces of the first and second transparent insulating layers 41 and 42 by the migration at the end portion of the second light reflective layer 61, the leakage of an electric current of the optical semiconductor laminated layer 20 can be suppressed.

The de-activated region 20z may not be formed in the outside region 20e of the optical semiconductor laminated layer 20, but may be formed, at least, in the periphery of the optical semiconductor laminated layer 20. And, the resistivity of the p-type semiconductor layer 24 and the active layer 23 corresponding to the periphery of the optical semiconductor laminated layer 20 may be enhanced.

Figure 2A:
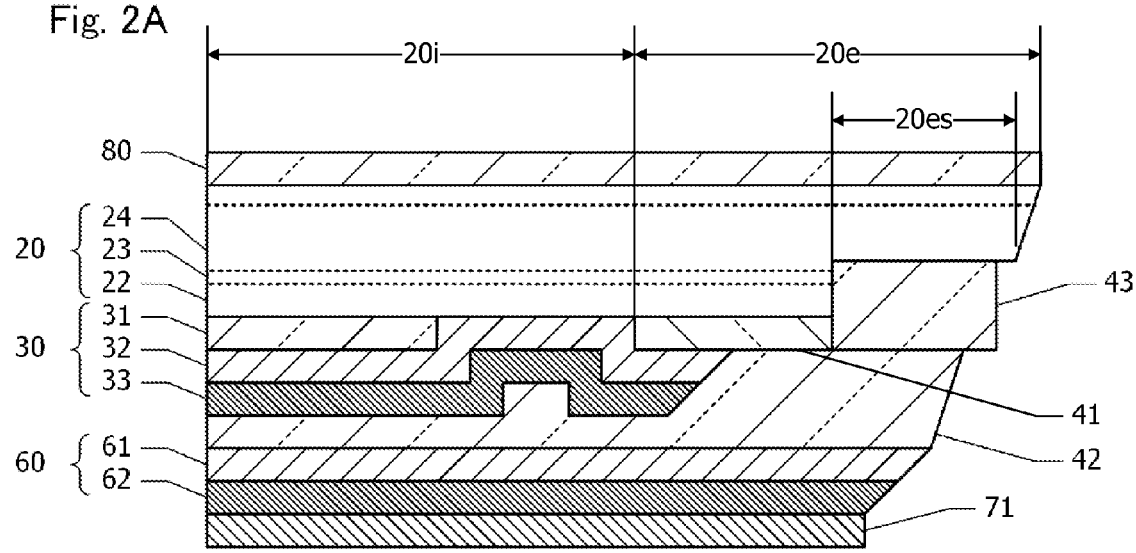
FIGS. 2A and 2B are cross-sectional views illustrating modifications of the LED element according to the embodiment.
Figure 2B:
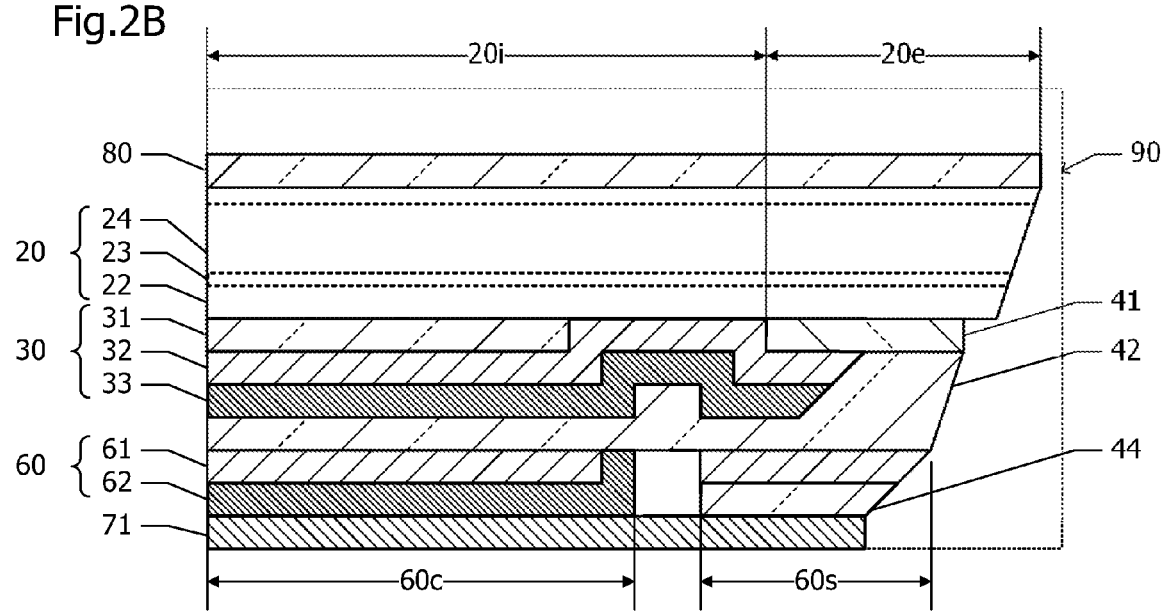

FIGS. 2A and 2B are cross-sectional views illustrating first and second modifications of the LED elements 101 according to the embodiment. A structure of suppressing the migration in the end portion of the second light reflective layer 61 is not limited to the structure illustrated in FIG. 1C.

As illustrated in FIG. 2A, it may be structured so that the p-type semiconductor layer 24 and the active layer 23 in a peripheral region 20es of the optical semiconductor laminated layer 20 is removed and a material (third transparent insulating layer) 43 having a light transmitting property and an electrical insulating property, such as $SiO_2$, is filled in this region. The third transparent insulating layer 43 may be formed to be integrated with the first transparent insulating layer 41 or the second transparent insulating layer 42.

In addition, as illustrated in FIG. 2B, it may be structured so that, for example, the conductive layer 60 including the second light reflective layer 61 is partitioned into a central portion 60c and a surrounding portion 60s, and the central portion 60c and the surrounding portion 60s are electrically separated.

The central portion 60c of the conductive layer 60 is electrically connected with the p-side electrode 30 or the n-side electrode 50. And, the second light reflective layer 61 corresponding to the central region 60c is covered with the second cap layer 62.

Meanwhile, the surrounding portion 60s of the conductive layer 60 is disposed to have a gap with the central portion 60c, and the second light reflective layer 61 corresponding to the surrounding portion 60s is electrically separated from the central portion 60c by interposing the fourth transparent insulating layer 44 between the second light reflective layer 61 and the first adhesion layer 71. In this manner, it is possible to suppress the migration in the end portion of the second light reflective layer 61 by causing the second light reflective layer 61 corresponding to the surrounding portion 60s to electrically float and causing an electric current not to be applied.

Figure 3A:
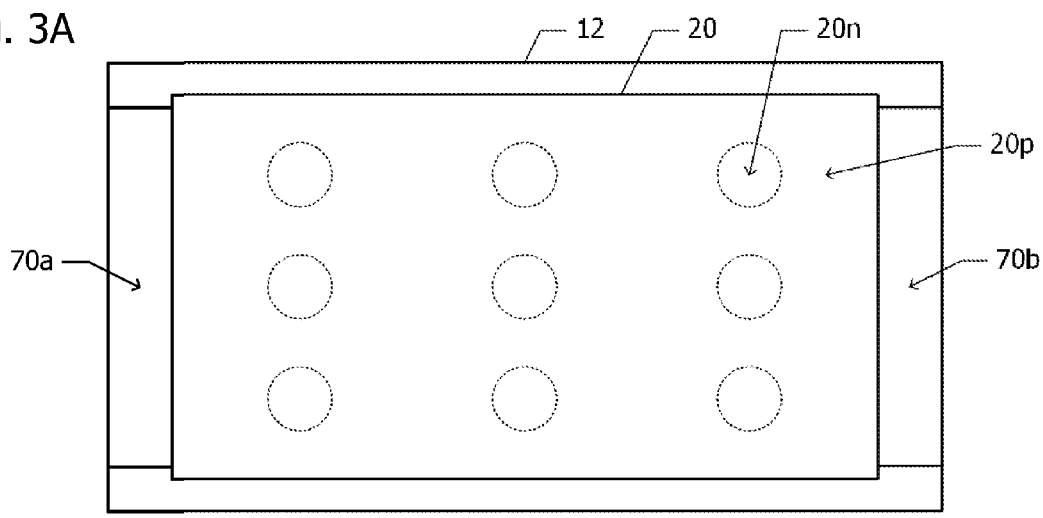
FIGS. 3A to 3C are plan views illustrating the LED elements according to the embodiment.
Figure 3B:
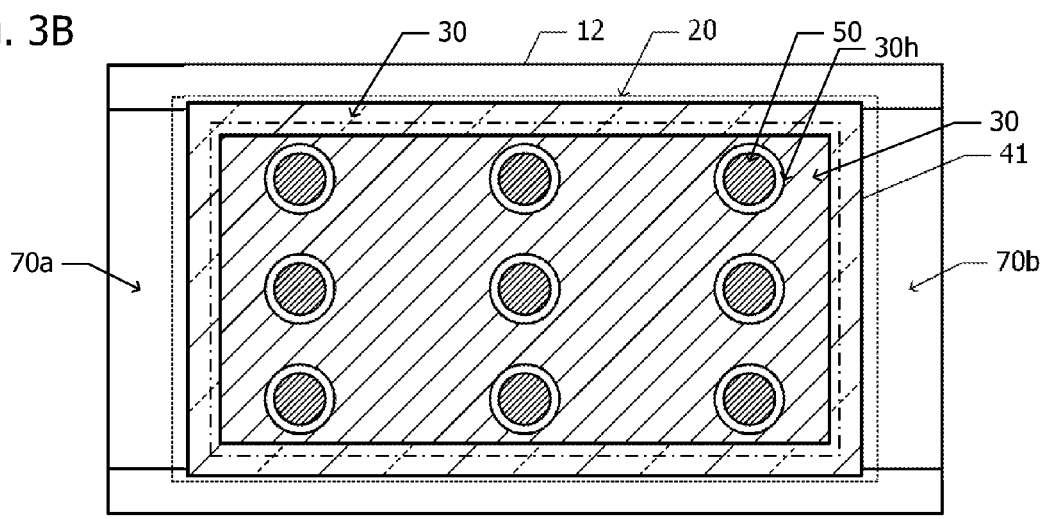
Figure 3C:
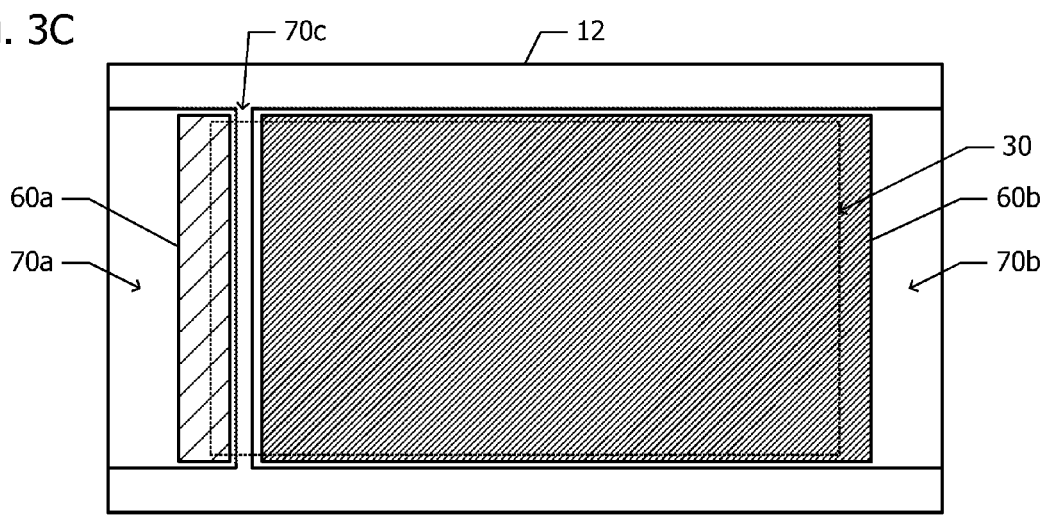

FIGS. 3A to 3C are plan views illustrating the LED elements 101 according to the embodiment. FIG. 3A mainly illustrates a whole planar shape of the optical semiconductor laminated layer 20. FIG. 3B mainly illustrates whole planar shapes of the p-side electrode 30, the n-side electrode 50, and the first transparent insulating layer 41. Further, in FIG. 3B, the optical semiconductor laminated layer 20 is illustrated with a dashed line. In addition, an outline of the p-side electrode 30 is illustrated by a dashed line. FIG. 3C mainly illustrates a whole planar shape of the conductive layer 60 including the first conductive region 60a (a region that is electrically connected to the p-side electrode 30) and the second conductive region 60b (a region that is electrically connected to the n-side electrode 50). In addition, in FIG. 3C, the p-side electrode 30 is illustrated with a dashed line.

As illustrated in FIG. 3A, the concave regions 20n (regions surrounded with dashed lines in FIG. 3A) of the optical semiconductor laminated layer 20 are, for example, circular, and are formed to be surrounded by the convex region 20p of the optical semiconductor laminated layer 20. And, the concave regions 20n are provided on the surface of the optical semiconductor laminated layer 20 to be evenly distributed in a matrix shape of 3 rows and 3 columns. The planar shape of the concave region 20n is not limited to be circular, but may be elliptic or rectangular. Also, the population is not limited to 3 rows and 3 columns, and more concave regions 20n may be provided.

In addition, the size, the shape, the distribution density, and the like of the concave region 20n (or the convex region 20p) influence the emission intensity, luminance unevenness, the color unevenness, and the like of the LED elements 101 (or the LED element array 100; see FIG. 1A). It is desirable that the size, the shape, the distribution density, or the like of the concave region 20n (or the convex region 20p) be appropriately adjusted according to the application of the LED elements 101 (or the LED element array 100).

As illustrated in FIG. 3B, the n-side electrode 50 (the region patterned with diagonal lines with relatively narrower intervals in FIG. 3B) has, for example, a circular shape, and is disposed at a position corresponding to the concave region 20n of the optical semiconductor laminated layer 20 (see FIG. 3A).

The p-side electrode 30 (the region patterned with diagonal lines with relatively broader intervals in FIG. 3B) is patterned to include a circular opening portion 30h through which the n-side electrode 50 (or the concave region 20n) at a position corresponding to the convex region 20p of the optical semiconductor laminated layer 20 can be viewed (see FIG. 3A). In addition, the planar shape of the opening portion 30h is not limited to be circular, but may be elliptical or rectangular. The terminal portion of the p-side electrode 30 (the edge portion of the first light reflective layer) is disposed to be overlaid on the first transparent insulating layer 41 (the region patterned with diagonal lines including solid lines and dashed lines in FIG. 3B).

As illustrated in FIG. 3C, the first conductive region 60a (the region patterned with diagonal lines with relatively broader intervals in FIG. 3C) of the conductive layer 60 and the second conductive region 60b (the region patterned with diagonal lines with relatively narrower intervals in FIG. 3C) of the conductive layer 60 are disposed to interpose the insulating region (gap) 70c therebetween and are electrically separated from each other, and the first fusion region 70a of the fusion layer 70 and the second fusion region 70b of the fusion layer 70 are disposed to interpose the insulating region (gap) 70c therebetween and are electrically separated from each other.

In addition, the planar shape of the conductive layer 60 including the first and second conductive region 60a and 60b is set to be a shape in which the p-side electrode 30 is included. Further, the first fusion region 70a of the fusion layer 70 is formed to be continued to the second fusion region of a neighboring LED element. Further, the second fusion region 70b of the fusion layer is formed to be continued to the first fusion region of a neighboring LED element (see FIG. 1A).

Hereinafter, with reference to FIGS. 4A to 4M, a method of manufacturing the LED element array 100 according to the embodiment is described focus especially on one LED element 101 from among the plurality of LED elements 101 that configure the LED element array 100. FIGS. 4A to 4M are cross-sectional views illustrating processes of manufacturing the LED elements 101. In addition, FIGS. 4A to 4M illustrate the LED elements 101 with those in FIGS. 1 to 3 upside down, for convenience.

Figure 4A:

First, as illustrated in FIG. 4A, a growth substrate 11 made with the C-plane sapphire substrate is prepared, and the optical semiconductor laminated layer 20 made with a GaN-based semiconductor using a metal organic chemical vapor deposition (MOCVD) is formed. Specifically, first, the growth substrate 11 is subjected to thermal cleaning, a buffer layer 21 made with GaN is grown. Subsequently, the optical semiconductor laminated layer 20 is formed by sequentially growing the n-type semiconductor layer 22 made with n-type GaN on which Si and the like are doped, the active layer (emission layer) 23 having multiquantum well structure including a well layer (InGaN) and a barrier layer (GaN), and the p-type semiconductor layer 24 made with p-type GaN on which Mg and the like is doped.

Further, the growth substrate 11 is a single-crystal substrate having a lattice constant that matches with the GaN crystal and is selected from a transparent substrate to light having a wavelength of 362 nm which is an absorption edge wavelength of the GaN crystal so that the growth substrate can be peeled off by the following laser lift-off process (see FIG. 4K). In addition to sapphire, spinel, ZnO, and the like can be used.

Further, a strain relaxation layer having a superlattice structure including an InGaN layer and a GaN layer may be grown between the n-type semiconductor layer 22 and the active layer 23 in the optical semiconductor laminated layer 20. Further, a clad layer made with p-type AlGaN may be grown between the active layer 23 and the p-type semiconductor layer 24.

Figure 4B:
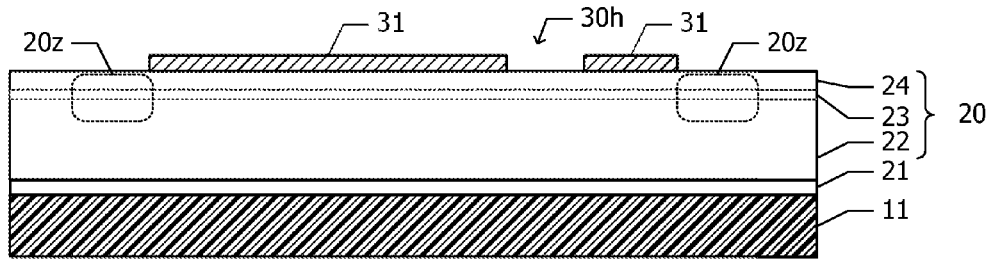

Subsequently, as illustrated in FIG. 4B, the contact layer 31 with a predetermined shape is formed by forming an ITO layer having a surface thickness of 10 nm on the surface of the optical semiconductor laminated layer 20 (the surface of the p-type semiconductor layer 24) by an electron beam vapor deposition method or the like and patterning the ITO layer by a photolithography method or a lift-off method. At this point, the contact layer 31 is patterned to include the opening portion 30h in order to form the concave region 20n in the following process (FIG. 4E). In addition to ITO, Ag, Ni, Pt, Al, Pd, and an alloy thereof can be used as the contact layer 31. Further, if a material having a light transmitting property such as ITO is used in the contact layer 31, it is preferable to perform a heat treatment on the contact layer 31 in order to enhance the contacting property with the p-type semiconductor layer 24.

Thereafter, the de-activated region 20z is formed by providing high resistivity to the optical semiconductor laminated layer 20 (the p-type semiconductor layer 24 and the active layer 23) positioned at a portion near the contact layer 31. The de-activated region 20z can be formed by performing a reverse sputtering treatment (for example, bias power of 300 W, for 3 minutes) using an inert gas such as Ar. In addition, the de-activated region 20z will not be illustrated in the following process, for convenience.

Figure 4C:
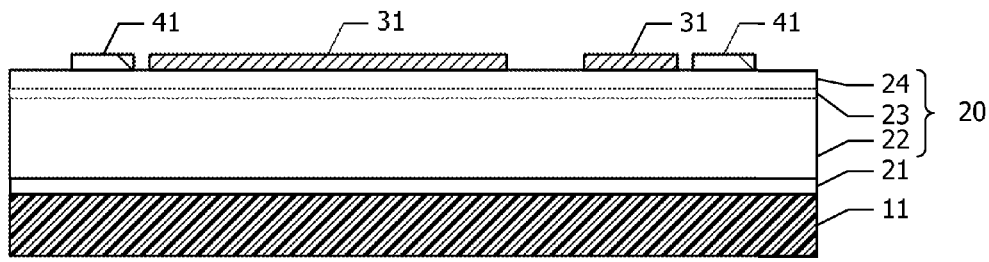

Subsequently, as illustrated in FIG. 4C, the first transparent insulating layer 41 is formed on the surface of the optical semiconductor laminated layer 20 in the portion near the contact layer 31. The first transparent insulating layer 41 is configured to have, for example, an $SiO_2$ layer with the same surface thickness of the contact layer 31. The first transparent insulating layer 41 can be formed so as to use, for example, a sputtering method and a lift-off method. In addition, in addition to $SiO_2$, SiN can be used as the first transparent insulating layer 41.

Figure 4D:
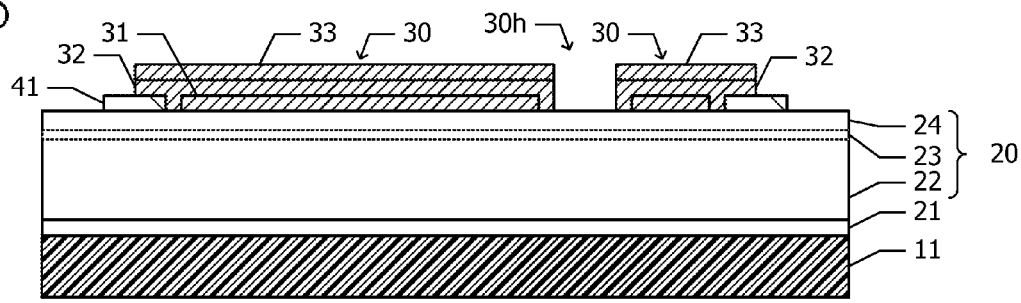
Figure 4E:
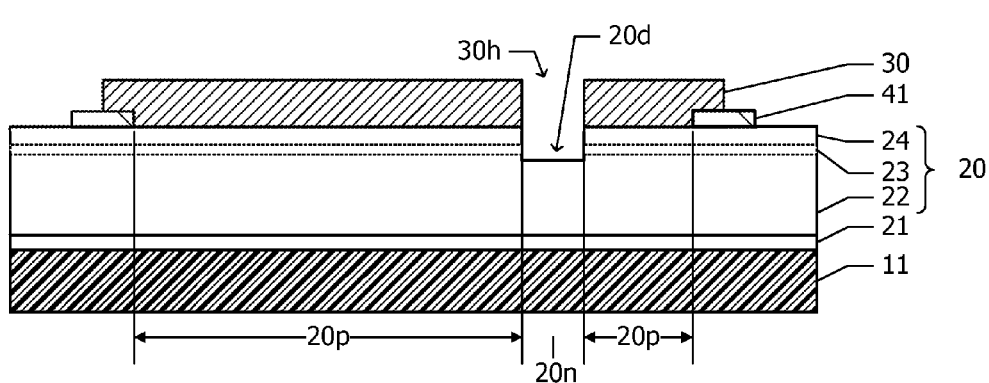

Subsequently, as illustrated in FIG. 4D, the first light reflective layer 32 and the first cap layer 33 that cover the contact layer 31, are mounted on a portion of the first transparent insulating layer 41, and include the opening portion 30h are formed. The first light reflective layer 32 is configured to have, for example, an Ag layer having a surface thickness of 100 nm, and the first cap layer 33 is configured to have a metal multi-layer made with TiW (250 nm)/Ti (50 nm)/Pt (100 nm)/Au (1000 nm)/Ti (30 nm). In addition, if Ag is included in the first light reflective layer 32, Ti, W, Pt, Pd, Mo, Ru, Ir, Au, an alloy thereof, and a metal nitride such as TiN can be used for the first cap layer 33. The first light reflective layer 32 and the first cap layer 33 can be formed so as to use, for example, by using a sputtering method and a lift-off method. Further, in the following process, for convenience, the contact layer 31, the first light reflective layer 32, and the first cap layer 33 are not illustrated, and are collectively referred to as the p-side electrode 30.

Subsequently, as illustrated in FIG. 4E, a via 20d is formed by etching a region of the optical semiconductor laminated layer 20 corresponding to the opening portion 30h of the p-side electrode 30, by dry etching method using a resist mask and a chlorine gas. The via 20d is formed to penetrate the p-type semiconductor layer 24 and the active layer 23, and the n-type semiconductor layer 22 is exposed in the bottom portion of the via 20d. According to this, the concave region 20n corresponding to the via 20d and the convex region 20p which is a region except for the concave region 20n are demarcated on the optical semiconductor laminated layer 20 (see FIGS. 1B to 3A).

Further, in the structure according to the first modification as illustrated in FIG. 2A, the p-type semiconductor layer 24 and the active layer 23 positioned in a portion near the first transparent insulating layer 41 can be etched at the same time of performing etching for forming the via 20d. Subsequently, the etched region may be filled with $SiO_2$ and the like (the third transparent insulating layer 43, see FIG. 2A). The third transparent insulating layer 43 can be formed by using, for example, a sputtering method and the like.

Figure 4F:
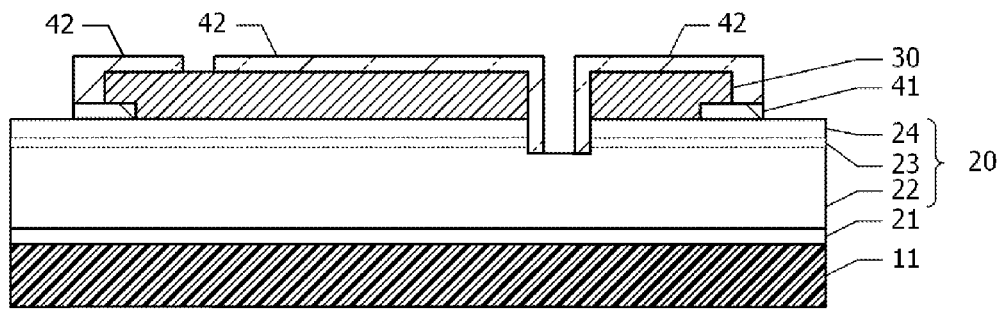

Subsequently, as illustrated in FIG. 4F, the second transparent insulating layer 42 that covers the p-side electrode 30 and the concave region 20n of the optical semiconductor laminated layer 20 is formed. First, an SiO₂ layer having a surface thickness of 300 nm is formed, by a sputtering method, on the p-side electrode 30 and in the concave region 20n of the optical semiconductor laminated layer 20. Subsequently, the second transparent insulating layer 42 is formed by etching the SiO₂ layer positioned on a portion of the upper surface of the p-side electrode 30 and the bottom surface portion of the concave region 20n (the via 20d) by performing dry etching using a resist mask and a CF4/Ar mixed gas. According to this, the terminal portion of the p-side electrode 30 is enveloped by the first and second transparent insulating layers 41 and 42. In addition, at this point, the n-type semiconductor layer 22 is exposed on the bottom surface of the concave region 20n. In addition, a portion of the p-side electrode is also exposed. In addition to SiO₂, SiN is used as the second transparent insulating layer 42.

Figure 4G:
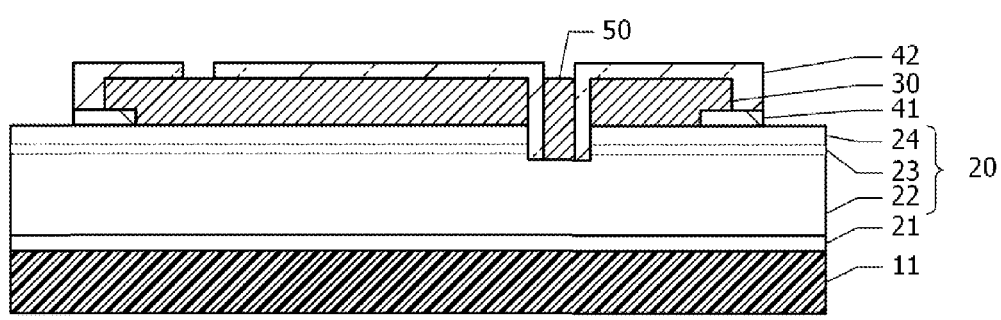

Subsequently, the n-side electrode 50 that is in contact with the n-type semiconductor layer 22 is formed in the concave region 20n of the optical semiconductor laminated layer 20 as illustrated in FIG. 4G. First, a metal multi-layer made with Ti (1 nm)/Ag (200 nm)/Ti (100 nm)/Pt (200 nm)/Au (200 nm) is formed on the second transparent insulating layer 42 and in a region in which the n-type semiconductor layer 22 is exposed inside the concave region 20n by an electron beam vapor deposition method or a sputtering method, or the like. Subsequently, the columnar n-side electrode 50 is formed by patterning the corresponding metal multi-layer by a lift-off method or the like. The material used for the n-side electrode 50 has low contact resistance, for example, preferably $1 \times 10^{-4}$ $\Omega cm^2$ or lower, and preferably has optical reflectivity. In addition, the n-side electrode 50 is preferably formed to be integrated with the conductive layer 60 in the process as illustrated in FIG. 4H.

Figure 4H:
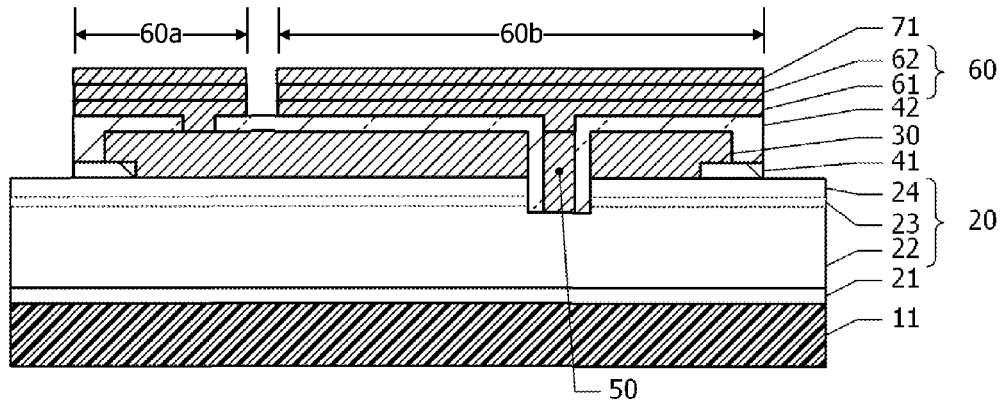

Subsequently, as illustrated in FIG. 4H, the conductive layer 60 and the first adhesion layer 71 that include the first conductive region 60a which is electrically connected to the p-side electrode 30 in the region in which a portion of the p-side electrode 30 is exposed and the second conductive region 60b which is electrically connected to the n-side electrode 50 are formed on the n-side electrode and the second transparent insulating layer 42.

First, a first metal multi-layer made with Ti (1 nm)/Ag (200 nm)/Ti (100 nm)/Pt (200 nm)/Au (200 nm), a second metal multi-layer made with Ti (50 nm)/Pt (100 nm), and a metal layer made with Au (100 nm) are formed on the second transparent insulating layer 42 and in the concave region 20n of the optical semiconductor laminated layer 20 by an electron beam vapor deposition method or a sputtering method, or the like. Here, the first metal multi-layer corresponds to the second light reflective layer 61 of the conductive layer 60, the second metal multi-layer corresponds to the second cap layer 62 of the conductive layer 60, and the metal layer corresponds to the first adhesion layer 71. Further, when Ag is included in the first metal multi-layer (the second light reflective layer 61), it is preferable to use Ti, W, Pt, Pd, Mo, Ru, Ir, Au, an alloy thereof, and a metal nitride such as TiN for the second metal multi-layer (the second cap layer 62).

Subsequently, the first and second metal multi-layers and the metal layer are separated into the first and second conductive region 60a and 60b by patterning the first and second metal multi-layers and the metal layer by a lift-off method and the like. According to this, the conductive layer 60 which is obtained by stacking the second light reflective layer 61 and the second cap layer 62 and which includes the first conductive region 60a electrically connected to the p-side electrode 30 and the second conductive region 60b electrically connected to the n-side electrode 50 is formed. Further, the first adhesion layer 71 having regions corresponding to the first and second conductive region 60a and 60b is formed.

In addition, in the structure according to the second modification as illustrated in FIG. 2B, the surrounding portion 60s that is partitioned on the periphery of the conductive layer 60 and the central portion 60c that is partitioned on the inner side than the surrounding portion 60s may be patterned at the same time of performing patterning for partitioning the first and second conductive region 60a and 60b. Then, in order to cause the second light reflective layer 61 corresponding to the surrounding portion 60s to electrically float, SiO₂ and the like (the fourth transparent insulating layer 44, see FIG. 2B) may be formed by covering the second light reflective layer 61 (and the second cap layer 62). The fourth transparent insulating layer 44 can be formed by using, for example, a sputtering method and the like.

In addition, in the following processes, for convenience, the second light reflective layer 61 and the second cap layer 62 are not illustrated, and are collectively referred to as the conductive layer 60.

Figure 4I:
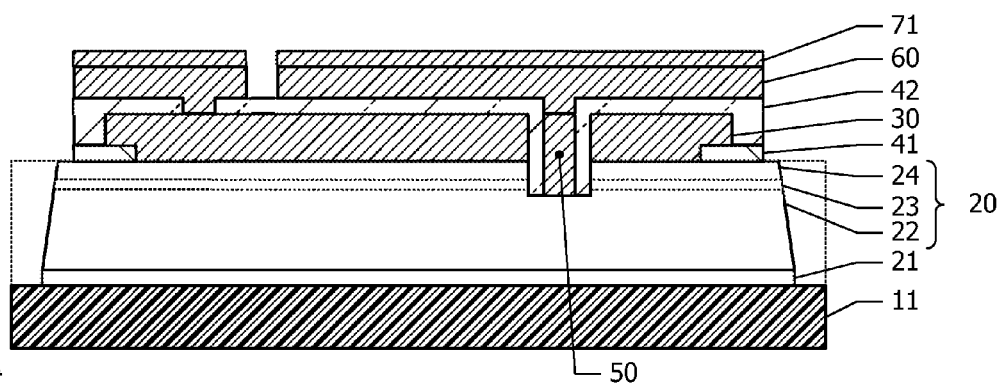

Subsequently, as illustrated in FIG. 4I, the optical semiconductor laminated layer 20 is divided into desired sizes by etching a portion of the optical semiconductor laminated layer 20 by a dry etching method using a resist mask and sa chlorine gas. Each divided portion of the optical semiconductor laminated layer 20 corresponds to an optical semiconductor laminated layer of each LED element 101 that configures the LED element array 100 (see FIG. 1A). Hereinafter, for convenience, a structure formed on the growth substrate 11 from the optical semiconductor laminated layer 20 to the first adhesion layer 71 is called a device structure body 102.

Subsequently, as illustrated in FIG. 4J, the supporting substrate 12 on which the second adhesion layer 72 is formed on the surface is prepared. It is preferable to use a material that has a thermal expansion coefficient close to sapphire ($7.5 \times 10^{-6}$/K) or GaN ($5.6 \times 10^{-6}$/K), and high thermal conductivity, as the supporting substrate 12. For example, Si, Ge, Mo, CuW, AlN, or the like can be used. If the Si substrate is used for the supporting substrate 12, the insulating layer 12a made with SiO₂ is formed, for example, by performing thermal oxidation to the surface of the Si substrate.

Thereafter, the second adhesion layer 72 including the first and second fusion regions 70a and 70b is formed on the supporting substrate 12 (the insulating layer 12a) by forming a metal multi-layer made with Ti/Ni/Au/Pt/AuSn (Sn: 20 wt %) by a sputtering method or the like and by patterning the metal multi-layer by a photolithography method, a lift-off method, or the like. In addition, the first and second fusion regions 70a and 70b are patterned so as to be separated from each other. Further, materials used as the second adhesion layer 72 (the uppermost layer of the metal multi-layer) and the first adhesion layer 71 joined thereto can use metals such as Au—Sn, Au—In, Pd—In, Cu—In, Cu—Sn, Ag—Sn, Ag—In, and Ni—Sn which can be joined by fusion joining and metals including Au which can be joined by diffusion joining.

Subsequently, as illustrated in FIG. 4K, the device structure body 102 manufactured in advance and the prepared supporting substrate 12 are disposed to face and to be in contact with the first and second adhesion layers 71 and 72 are maintained for 10 minutes under the pressure of 3 MPa in 300° C. In addition, the device structure body 102 and the supporting substrate 12 are disposed so that the first conductive region 60a (FIG. 4H) faces and is in contact with the first fusion region 70a (FIG. 4J), and the second conductive region 60b (FIG. 4H) faces and is in contact with the second fusion region 70b (FIG. 4J). Subsequently, the result is cooled up to room temperature, and first and second adhesion layers 71 and 72 are subjected to fusion joining (the fusion layer 70).

Subsequently, the optical semiconductor laminated layer 20 and the growth substrate 11 are separated from each other by a laser lift-off method. Specifically, the buffer layer 21 is pyrolyzed by radiating a KrF excimer laser beam (wavelength: 248 nm, irradiated energy density: 800 mJ/cm$^2$ to 900 mJ/cm$^2$) from the growth substrate 11 to the optical semiconductor laminated layer 20. According to this, the growth substrate 11 and the optical semiconductor laminated layer 20 are separated.

Thereafter, Ga generated by pyrolysis of the buffer layer 21 (GaN crystal) are removed by hot water or the like and the surface of the optical semiconductor laminated layer 20 (the buffer layer 21 and a portion of the n-type semiconductor layer 22) is etched by a hydrochloric acid or sodium hydroxide or the like. According to this, as illustrated in FIG. 4L, the n-type semiconductor layer 22 of the optical semiconductor laminated layer 20 is exposed.

Subsequently, as illustrated in FIG. 4M, the so-called micro-cone structured layer 22a is formed on the surface of the n-type semiconductor layer 22 of the optical semiconductor laminated layer 20. When the micro-cone structured layer 22a is formed, wet etching may be performed on, for example, the surface of the n-type semiconductor layer 22, by a tetramethylammonium hydroxide (TMAH) solution (temperature of about 70° C., concentration of about 25%) or the like. Subsequently, the surface protection layer 80 made with SiO$_2$ or the like is formed on the n-type semiconductor layer 22 (the micro-cone structured layer 22a), by the chemical vapor deposition (CVD) or the like. According to this, each of the LED elements 101 that configures the LED element array 100 is completed.

Thereafter, as illustrated in FIG. 1A, the supporting substrate 12 is divided, for example, into a size in which four LED elements 101 are disposed, by laser beam scribing or dicing. Subsequently, the florescent layer 90 is formed by dripping, for example, a resin including a yellow phosphor to cover the plurality of LED elements 101 on the entire surface of the supporting substrate 12, and curing the resin. According to the above, the LED element array 100 is completed.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the invention have been described in detail, it should be understood that the various changes, substitutions, and alterations could be made hereto without departing from the spirit and scope of the invention.

The invention claimed is:

1. A semiconductor light emitting element, comprising:
   an optical semiconductor laminated layer that is obtained by stacking a first semiconductor layer including a GaN-based semiconductor of a first conductivity type, an active layer formed on the first semiconductor layer, having a light emitting property, and including a GaN-based semiconductor, and a second semiconductor layer formed on the active layer, and including a GaN-based semiconductor of a second conductivity type different from the first conductivity type, and in which when a surface on the first semiconductor layer side is a first surface and a surface on the second semiconductor side is a second surface, the second surface includes concave region formed by removing the second semiconductor layer and the active layer and exposing the first semiconductor layer, and convex region surrounding the concave region and exposing the second semiconductor layer;
   a first electrode that is disposed on the concave region of the optical semiconductor laminated layer and that is in contact with the first semiconductor layer exposed in the concave region;
   a second electrode that is disposed on the convex region of the optical semiconductor laminated layer, that is separated from the second semiconductor layer in a peripheral portion of the second electrode, that is in contact with the second semiconductor layer in a region except for the peripheral portion of the second electrode, and that includes at least Ag;
   a first transparent insulating layer that is disposed between the peripheral portion of the second electrode and the second semiconductor layer of the optical semiconductor laminated layer, and that has a light transmitting property and an electrical insulating property; and
   a second transparent insulating layer that is disposed to cover the second electrode, that envelops the peripheral portion of the second electrode together with the first transparent insulating layer, and that has a light transmitting property and an electrical insulating property.

2. The semiconductor light emitting element according to claim 1,
   wherein the second electrode has a stacked structure obtained by stacking:
   a contact layer that is disposed on the convex region of the optical semiconductor laminated layer, to be in contact with the second semiconductor layer, and includes at least one material selected from the group consisting of Ag, Pt, Ni, Al, Pd, an alloy thereof, and indium tin oxide;
   a first light reflective layer that covers the contact layer, is disposed to be mounted on the first transparent insulating layer in the periphery, and includes at least Ag; and
   a first cap layer that is disposed to overlap the first light reflective layer, and includes at least one material selected from the group consisting of Ti, W, Pt, Pd, Mo, Ru, Ir, Au, an alloy thereof, and a metal nitride.

3. The semiconductor light emitting element according to claim 1, further comprising:
   a conductive layer that is disposed on the second transparent insulating layer, has a shape of including the second electrode in a plan view, and includes at least Ag.

4. The semiconductor light emitting element according to claim 3,
   wherein the conductive layer has a stacked structure obtained by stacking:
   a second light reflective layer that is disposed on the second transparent insulating layer, has a shape of including the second electrode in a plan view, and includes at least Ag; and
   a second cap layer that is disposed to overlap the second light reflective layer, and includes at least one material selected from the group consisting of Ti, W, Pt, Pd, Mo, Ru, Ir, Au, an alloy thereof, and a metal nitride.

5. The semiconductor light emitting element according to claim 3,
   wherein the conductive layer includes a first region that is partitioned in the periphery and a second region that is partitioned on an inner side than the first region and is electrically insulated from the first region.

6. The semiconductor light emitting element according to claim 3,
wherein a part of the second semiconductor layer and the active layer positioned in a relatively outer side of the optical semiconductor laminated layer have higher resistance than other part of the second semiconductor layer and the active layer that are positioned in a relatively inner side of the optical semiconductor laminated layer.

7. The semiconductor light emitting element according to claim 3,
wherein a part of the second semiconductor layer and the active layer positioned in a periphery of the optical semiconductor laminated layer are removed,
further comprising:
a third transparent insulating layer that is filled in a space corresponding to the removed part of the second semiconductor layer and the active layer positioned in the periphery of the optical semiconductor laminated layer, and has a light transmitting property and an electrical insulating property.

8. The semiconductor light emitting element according to claim 7,
wherein the first to third transparent insulating layers include $SiO_2$ or SiN.

9. The semiconductor light emitting element according to claim 1,
wherein first electrode includes at least Ag.

10. The semiconductor light emitting element according to claim 1, further comprising:
a sealing resin that is disposed to cover at least a first surface of the optical semiconductor laminated layer, and includes a phosphor.

* * * * *